(12) United States Patent  (10) Patent No.: US 7,968,385 B2
Jeong et al.  (45) Date of Patent: Jun. 28, 2011

(54) THIN FILM TRANSISTOR PANEL AND FABRICATING METHOD THEREOF

(75) Inventors: Chang-Oh Jeong, Suwon-si (KR); Dong-Hoon Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/605,566

(22) Filed: Oct. 26, 2009

(65) Prior Publication Data

US 2011/0012203 A1  Jan. 20, 2011

(30) Foreign Application Priority Data

Jul. 20, 2009 (KR) .................. 10-2009-0066070

(51) Int. Cl.
  *H01L 21/00* (2006.01)
(52) U.S. Cl. ............... 438/154; 438/23; 438/34; 438/99
(58) Field of Classification Search .................... 438/23, 438/34, 99, 154
  See application file for complete search history.

(56) References Cited

U.S. PATENT DOCUMENTS

2009/0146147 A1* 6/2009 Kim ............................... 257/59
2009/0188438 A1* 7/2009 Schmucker ................... 119/601
2010/0323482 A1* 12/2010 Choi et al. .................... 438/158

* cited by examiner

*Primary Examiner* — Long Pham
(74) *Attorney, Agent, or Firm* — Cantor Colburn LLP

(57) ABSTRACT

A thin film transistor panel includes; an insulating substrate, a gate line including a gate electrode disposed on the insulating substrate, a gate insulating layer disposed on the gate electrode, a semiconductor layer disposed on the gate insulating layer, the semiconductor layer including a sidewall, a data line including a source electrode disposed on the semiconductor layer, a drain electrode disposed substantially opposite to and spaced apart from the source electrode, a first protective film disposed on the data line, the first protective film including a sidewall, a second protective film disposed on the first protective film and including a sidewall, and a pixel electrode electrically connected to the drain electrode, wherein the sidewall of the second protective film is disposed inside an area where the sidewall of the first protective film is disposed, and the source electrode and the drain electrode cover the sidewall of the semiconductor layer.

10 Claims, 16 Drawing Sheets

THIN FILM TRANSISTOR PANEL AND FABRICATING METHOD THEREOF

This application claims priority to Korean Patent Application No. 10-2009-0066070, filed on Jul. 20, 2009, and all the benefits accruing therefrom under 35 U.S.C. §119, the content of which in its entirety is herein incorporated by reference.

BACKGROUND OF THE INVENTION

1. Field of the Invention

Exemplary embodiments of the present invention relate to a thin film transistor panel and a fabricating method thereof.

2. Discussion of the Background

A flat panel display, such as a liquid crystal display ("LCD") or an organic light emitting display ("OLED"), typically includes pairs of field generating electrodes and an electro-optical active layer interposed between each pair of field generating electrodes.

A pixel electrode, which is one of the electrodes in the pair of field generating electrodes, can be connected to a switching element that transmits electrical signals to the pixel electrode. The electro-optical active layer converts the electrical signal into an optical signal to display images.

A thin film transistor ("TFT") is typically used for the switching element in the flat panel display. Typically, a plurality of layers are deposited and then patterned, e.g., by photolithography processes using masks, thereby fabricating the TFT. However, the use of photolithography processes includes multiple steps, such as photo-resist coating, mask arrangement, exposure, baking, development, and cleaning. Thus, repeated photolithography processes increase entire processing time and the manufacturing cost of an associated flat panel display.

In order to reduce the number of photolithography process, a technique in which a semiconductor layer and a metal layer are simultaneously patterned to form an active layer and a source electrode and a drain electrode of the TFT has been studied.

However, this technique can cause the active layer to protrude beyond the source and the drain electrodes, thereby resulting in image degradation.

BRIEF SUMMARY OF THE INVENTION

Exemplary embodiments of the present invention provide a thin film transistor panel having improved image display capabilities.

Additional features of the invention will be set forth in the description which follows, and in part will be apparent from the description, or may be learned by practice of the invention.

An exemplary embodiment of the present invention discloses a thin film transistor panel including; an insulating substrate, a gate line including a gate pad and a gate electrode, the gate line being disposed on the insulating substrate, a semiconductor layer disposed on the gate electrode, the semiconductor layer including at least one sidewall, a data line including a source electrode disposed on the semiconductor layer, a drain electrode disposed substantially opposite to and spaced apart from the source electrode with respect to the gate electrode, a first protective film disposed on the data line and the drain electrode and having a contact hole which exposes at least a portion of the drain electrode, a second protective film disposed on the first protective film, a pixel electrode disposed on the first protective film and electrically connected to the drain electrode, an interconnector disposed on the gate pad, and a contact assistant disposed on the interconnector, wherein the source electrode and the drain electrode directly contact substantially an entire surface area of the at least one sidewall of the semiconductor layer.

An exemplary embodiment of the present invention also discloses a thin film transistor panel including; an insulating substrate, a gate line disposed on the insulating substrate, a data line disposed substantially perpendicular to the gate line, a thin film transistor including a first electrode connected to the gate line, a second electrode connected to the data line and a third electrode disposed substantially opposite to and spaced apart from the second electrode with respect to the first electrode, a semiconductor layer disposed on the first electrode, the semiconductor layer including at least one sidewall, a gate pad member which is supplied with a gate signal and is disposed on an end of the gate line, and a data pad member which is supplied with a data signal and is disposed on an end of the data line, wherein the second electrode and the third electrode cover the at least one sidewall of the semiconductor layer, and the gate pad member includes a first conductive layer, a second conductive layer, and a third conductive layer.

An exemplary embodiment of the present invention also discloses a thin film transistor panel including; an insulating substrate, a gate line including a gate electrode disposed on the insulating substrate, a gate insulating layer disposed on the gate electrode, a semiconductor layer disposed on the gate insulating layer, the semiconductor layer including at least one sidewall, a data line including a source electrode disposed on the semiconductor layer, a drain electrode disposed substantially opposite to and spaced apart from the source electrode with respect to the gate electrode, a first protective film disposed on the data line, the first protective film including at least one sidewall, a second protective film disposed on the first protective film, the second protective film including at least one sidewall, and a pixel electrode electrically connected to the drain electrode, wherein the at least one sidewall of the second protective film is disposed inside an area where the at least one sidewall of the first protective film is disposed, and the source electrode and the drain electrode cover the at least one sidewall of the semiconductor layer.

An exemplary embodiment of the present invention also discloses a method for manufacturing a thin film transistor including; disposing a gate line including a gate electrode and a gate pad on an insulating substrate, disposing a gate insulating layer on the gate line, disposing a semiconductor layer on the gate insulating layer, disposing a data line including a source electrode and a data pad on the semiconductor layer, disposing a drain electrode spaced apart from the source electrode with respect to the gate electrode on the semiconductor layer, disposing a first insulating layer and a second insulating layer on the data line and the drain electrode, etching the first insulating layer and the second insulating layer to form a second protective film, a first protective film having a sidewall which protrudes beyond the second protective film on the semiconductor layer, and a first contact hole which exposes a portion of the drain electrode, and disposing a pixel electrode electrically connected to the drain electrode.

An exemplary embodiment of the present invention also discloses a method for manufacturing a thin film transistor including; disposing a gate line including a gate electrode and a gate pad on an insulating substrate, disposing a first insulating layer on the gate line, disposing a semiconductor layer on the first insulating layer, exposing a gate pad through the semiconductor layer, forming a data line including a source electrode disposed on the semiconductor layer, a data pad disposed on the first insulating layer, a drain electrode disposed substantially opposite the source electrode with respect to the gate electrode, and an interconnector disposed on the exposed gate pad, disposing a second insulating layer and a third insulating layer on the data line and the drain electrode, etching the third insulating layer and the second insulating layer to form a contact hole which exposes a portion of the drain electrode, and disposing a pixel electrode electrically connected to the drain electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention, wherein.

DETAILED DESCRIPTION OF THE INVENTION

Figure 1:
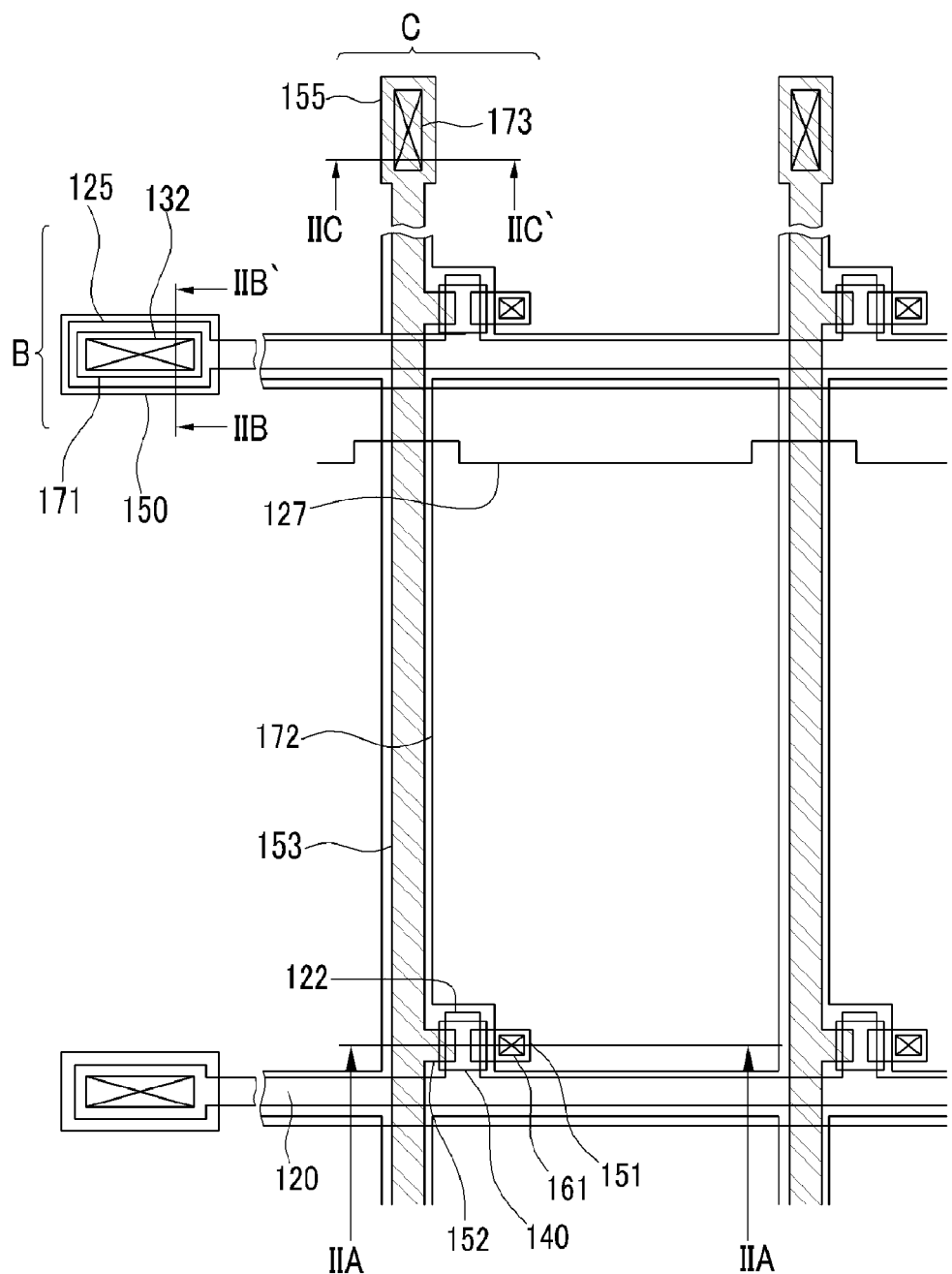
FIG. 1 is a top plan view of an exemplary embodiment of a thin film transistor ("TFT") panel according to the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. Like reference numerals refer to like elements throughout.

It will be understood that when an element is referred to as being "on" another element, it can be directly on the other element, or intervening elements may be present. In contrast, when an element is referred to as being "directly on" another element, there are no intervening elements present. As used herein, the term "and/or" includes any and all combinations of one or more of the associated items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the present invention will be described in detail with reference to the accompanying drawings.

Figure 2A:
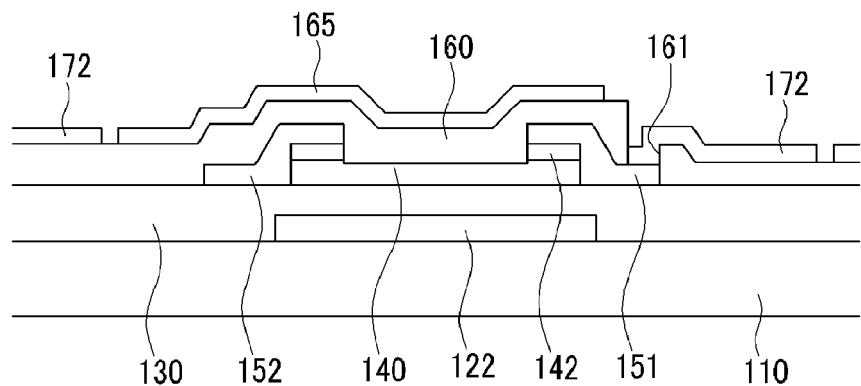
FIG. 2A to FIG. 2C are cross-sectional views taken along lines IIA-IIA', IIB-IIB', and IIC-IIC' of FIG. 1, respectively, according to an exemplary embodiment of the present invention.
Figure 2B:
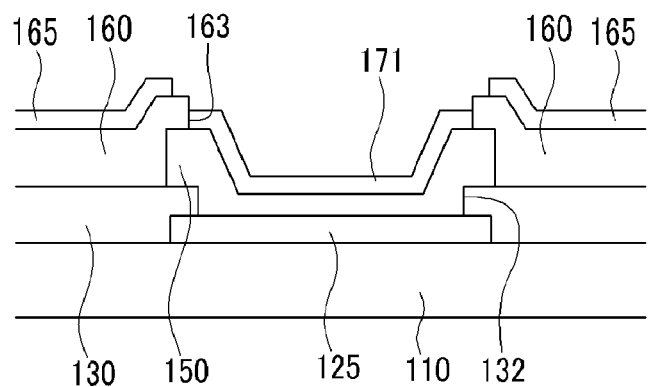
Figure 2C:
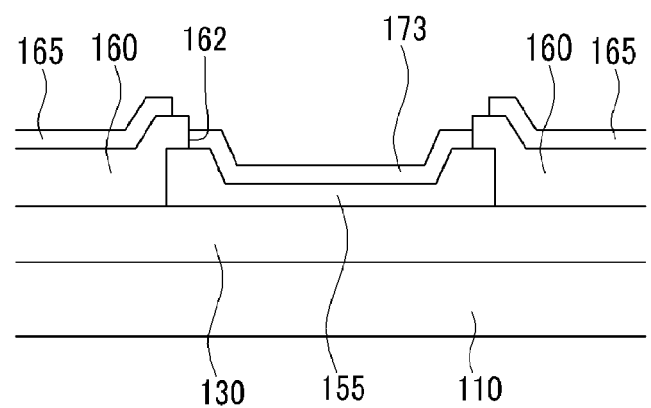

FIG. 1 is a top plan view of an exemplary embodiment of a thin film transistor ("TFT") panel according to the present invention, and FIG. 2A to FIG. 2C are cross-sectional views taken along lines IIA-IIA', IIB-IIB', and IIC-IIC' of FIG. 1 respectively. While only a single pixel of the TFT panel is illustrated in FIGS. 1-2C, one of ordinary skill in the art may appreciate that a plurality of pixels may be included and in one exemplary embodiment may form a matrix pattern on the TFT panel.

Referring to FIG. 1 and FIG. 2A, a plurality of gate lines 120 and a plurality of storage electrode lines 127 are formed on an insulating substrate 110, exemplary embodiments of which may include a glass substrate, a plastic substrate or a substrate made from other materials having similar characteristics.

The gate lines 120 extend in a transverse direction and transmit gate signals therealong. Each gate line 120 includes a gate electrode 120 protruded from the gate line 122 and a gate pad 125. A driving signal is applied to the gate pad 125 from an external driving circuit. Alternative exemplary embodiments include configurations wherein the gate pad 125 is omitted and the gate lines 120 receive driving signals from a driving circuit disposed on the substrate 110.

Referring to FIG. 2B, an interconnector 150 and a contact assistant 171 are disposed on the gate pad 125. The interconnector 150 includes a conductive layer to electrically connect the gate pad 125 to the contact assistant 171. Exemplary embodiments of the contact assistants 171 can include a transparent conductive layer and improve the contact characteristic between the gate pad 125 and an external driving circuit. Exemplary embodiments include configurations wherein the contact assistants 171 may be omitted. The gate pad 125, the interconnector 150, and the contact assistant 171 form a gate pad member B. The gate pad member B includes a three-layered structure and can improve reliability of the connections between the gate lines 120 and the driving circuitry. In a comparative embodiment wherein the gate pad member B includes double-layered structure including aluminum as a gate pad and indium tin oxide as a contact assistant, indium tin oxide may not protect aluminum enough from corrosion; however, this undesirable effect may be decreased or effectively prevented by the triple-layered structure described above. As described above, exemplary embodiments wherein an interconnector including a metal conductor and disposed between the gate pad 125 and the contact assistant 171 can enhance protection of the gate pad 125.

Referring to FIG. 1 and FIG. 2A, each storage electrode line 127 extends substantially in parallel with and adjacent to the gate line 120. The storage electrode line 127 is provided with a preset voltage. However, alternative exemplary embodiments of the storage electrode line 127 can have various shapes and arrangements. Alternative exemplary embodiments also include configurations wherein the storage electrode line 127 is omitted.

Exemplary embodiments of the gate line 120 and the storage electrode line 127 can include silver based metal such as silver (Ag) or silver alloy, copper based metal such as copper (Cu), copper alloy, molybdenum based metal such as molybdenum (Mo) or molybdenum alloy, chromium (Cr), tantalum (Ta) and titanium (Ti) and other materials with similar characteristics. In one exemplary embodiment, the gate line 120 and the storage electrode line 127 can include a two-layered structure such Al and Mo or Ti and Cu.

A gate insulating layer 130 is formed on the gate line 120 and the storage electrode line 127. Exemplary embodiments of the gate insulating layer 130 can include silicon nitride (SiNx), silicon oxide (SiOx) or other similar materials. The gate insulating layer 130 includes a gate pad contact hole 132 to expose the gate pad 125. The gate pad 125 is electrically connected to the interconnector 150 through the gate pad contact hole 132.

A plurality of semiconductor layers 140, exemplary embodiments of which may be formed of hydrogenated amorphous silicon (a-Si) or poly silicon, is disposed on the gate insulating layer 130. A plurality of ohmic contact layers 142 is formed on the semiconductor layer 140. Exemplary embodiments of the ohmic contact layer 142 can include silicide or n type hydrogenated amorphous silicon highly doped with n type impurity such as phosphorous or other materials with similar characteristics.

A plurality of data lines 153 and a plurality of drain electrodes 151 are formed on the semiconductor layer 140, the ohmic contact layer 142 and the gate insulating layer 130. The data lines 153 transmit data signals and extend in a longitudinal direction to be disposed substantially perpendicular to the gate lines 120. Each data line 153 includes a plurality of source electrodes 152 projecting toward the gate electrode 122 and a data pad 155 for contact with another layer or an external driving circuit. Exemplary embodiments include configurations wherein the data pad 155 is omitted and the data lines 153 are directly connected to the driving circuitry.

Referring to FIG. 2C, the data pad 155 is connected to a contact assistant 173 including a transparent conductive layer. The contact assistant 173 can improve the contact characteristic between the data pad 155 and the external driving circuit. The data pad 155 and the contact assistant 173 form a data pad member C of FIG. 1.

Referring FIG. 1 and FIG. 2A, the drain electrode 151 is separated from the data line 153 and the source electrode 152. The drain electrode 151 faces the source electrode 152 with respect to the gate electrode 122.

The gate electrode 122, the source electrode 152 and the drain electrode 151 together with the semiconductor layer 140 forms a TFT. A channel of the TFT is formed on the semiconductor layer 140 between the source electrode 152 and the drain electrode 151.

Exemplary embodiments of the data line 153 and the drain electrode 151 can include silver based metal such as silver (Ag) or a silver alloy, copper based metal such as copper (Cu), a copper alloy, molybdenum based metal such as molybdenum (Mo) or a molybdenum alloy, chromium (Cr), tantalum (Ta) and titanium (Ti) or other materials having similar characteristics. In one exemplary embodiment, the data line 153 and the drain electrode 151 can have a double-layered structure including a lower layer and an upper layer. In such an exemplary embodiment, the lower layer can include titanium (Ti) or titanium nitride (TiNx) or other materials having similar characteristics. Also, in such an exemplary embodiment, the upper layer can include copper (Cu) or a copper alloy or other material having similar characteristics. In another exemplary embodiment, the data line 153 and the drain electrode 151 can have a multi-layered structure including molybdenum (Mo), aluminum (Al), and molybdenum (Mo), or other similar materials.

The source electrode 152 and the drain electrode 151 cover sidewalls of the semiconductor layer 140. Specifically, the semiconductor layer 140 is formed with a predetermined thickness and edges of the semiconductor layer 140 include surfaces extending from the top surface of the semiconductor layer 140 down to the gate insulating layer 130; these surfaces are hereinafter referred to as "sidewalls" of the semiconductor layer 140. In one exemplary embodiment, the source electrode 152 and the drain electrode 151 extend from the ohmic contacts 142 down to the gate insulating layer 130 and extend over the sidewalls of the semiconductor layer 140 making direct contact with the sidewalls of the semiconductor layer 140 along the entire surface of the sidewalls. As shown in FIG. 1, the semiconductor layer 140 would include at least four sidewalls, e.g., two sidewalls extending lengthwise substantially parallel to the gate lines 120 and two sidewalls extending perpendicularly to the gate lines 120. Alternative exemplary embodiments include configurations having a greater number of sidewalls (e.g., an octagon-shaped semiconductor layer) or a lesser number of sidewalls (e.g., if the semiconductor is a conical-frustum shape).

A first protective film 160 is formed on the data line 153, the drain electrode 151, the semiconductor layer 140 disposed between the drain electrode 151 and the source electrode 152, and a portion of the gate insulating layer 130. Exemplary embodiments of the first protective film 160 can include silicon nitride (SiNx) or other similar materials. In one exemplary embodiment, the first protective film 160 can have a thickness of about 1000 Å to about 3000 Å. The first protective film 160 includes a drain contact hole 161, an interconnect contact hole 163, and a data pad contact hole 162. The drain contact hole 161 exposes a portion of the drain electrode 151. The interconnect contact hole 163 exposes the interconnector 150, and the data pad contact hole 162 exposes the data pad 155.

A second protective film 165 is formed on the first protective film 160. A sidewall of the second protective film 165 is located inside an area where the first protective film 160 is disposed, wherein the sidewall of the second protective film 165 refers to a portion of the second protective film 165 similar to the sidewall of the semiconductor layer 140 discussed above, e.g., the sidewall is the portion of the second protective film 165 extending from a top surface thereof down to the layer on which the second protective film 165 is disposed. The second protective film 165d occupies a smaller area than an area where the first protective film 160 is disposed, as seen from a top plan view. That is, the sidewall of the second protective film 165 is disposed inside the area where the sidewall of the first protective film 160 is disposed. A portion of the first protective film 160 extends beyond the second protective film 165 to be exposed thereby. Exemplary embodiments of the second protective film 165 can include silicon nitride SiNx or other materials having similar characteristics. In one exemplary embodiment, the second protective film 165 can have a thickness in range of about 1000 Å to about 3000 Å.

A plurality of pixel electrodes 172 is formed on a portion of the first protective film 160 exposed beyond the second protective film 165. Each pixel electrode 172 is electrically connected to the drain electrode 151 through the drain contact hole 161. A sidewall of the first protective film 160 is disposed contacting the drain electrode 151. In one exemplary embodiment, a sidewall of the pixel electrode 172 can contact a sidewall of the first protective film 160 disposed on and overlapped with the drain electrode 151. Alternative exemplary embodiments include configurations wherein a sidewall of the pixel electrode 172 can be spaced apart from a sidewall of the second protective film 165. Exemplary embodiments of the pixel electrode 172 can include a transparent conductive layer such as indium tin oxide ("ITO") or indium zinc oxide ("IZO"), or a reflective film such as aluminum (Al), silver (Ag), chromium (Cr), or alloys thereof or other materials having similar characteristics.

Contact assistants 171 and 173 are formed on the interconnector 150 and the data pad 154. In one exemplary embodiment, the contact assistants 171 and 173 can include the same layer as the pixel electrode 172; specifically, the contact assistants 171 and 173 may be formed at the same time as the pixel electrode 172 and may include substantially the same material as the pixel electrode 172. As will be described in more detail below, the contact assistants 171 and 173 may be formed during a same deposition process as the pixel electrode 172, and a metal layer for forming the pixel electrode 172 may be etched or otherwise removed to leave the pixel electrode 172 and the contact assistants 171 and 172. In one exemplary embodiment, sidewalls of contact assistants 171 and 173 can contact sidewalls of the first protective film 160.

The pixel electrode 172 is provided with a data voltage from the drain electrode 151 of the TFT. The pixel electrodes 172 supplied with the data voltages generate electric fields in cooperation with a common electrode (not shown). In an exemplary embodiment wherein the TFT panel is used in a liquid crystal display ("LCD"), a liquid crystal layer is disposed between the two electrodes. The generated electric fields determine the orientations of the liquid crystal molecules.

In the exemplary embodiments wherein the storage capacitor Cst is present, the pixel electrode 172 overlaps partially with the storage electrode line 127 to form a storage capacitor Cst. The storage capacitor Cst maintains voltages between the pixel electrode 172 and the common electrode after the TFT turns off. The gate insulating layer 130 and the first protective film 160 are disposed between the pixel electrode 171 and the storage electrode line 127.

According to an exemplary embodiment of the present invention, the source electrode 152 and the drain electrode 151 cover sidewalls of the semiconductor 140, thereby preventing the semiconductor layer 140 from protruding beyond the source electrode 152 and the drain electrode 151. Accordingly, image degradation resulting from a semiconductor layer protruding beyond the source electrode 152 and the drain electrode 151 can be reduced or effectively eliminated. Also, the interconnector 150 disposed between the gate pad 125 and the contact assistant 171 can improve reliability of connections therebetween.

FIG. 3A to FIG. 14C are cross-sectional views illustrating exemplary embodiments of processing steps for manufacturing the exemplary embodiment of a TFT panel of FIG. 1. In detail, FIGS. 3A, 4A, 5A, 6A, 7A, 8A, 9A, 10A, 11A, 12A, 13A, 14A, 15A and 16A are cross-sectional views illustrating processing steps of manufacturing the thin film transistor panel cross-sectional view shown in FIG. 2A, FIGS. 3B, 4B, 5B, 6B, 7B, 8B, 9B, 10B, 11B, 12B, 13B, 14B, 15B and 16B are cross-sectional views illustrating processing steps of manufacturing the thin film transistor panel cross-sectional view shown in FIG. 2B, and FIGS. 3C, 4C, 5C, 6C, 7C, 8C, 9C, 10C, 11C, 12C, 13C, 14C, 15C and 16C are cross-sectional views illustrating processing steps of manufacturing the thin film transistor panel cross-sectional view shown in FIG. 2C.

Figure 3A:
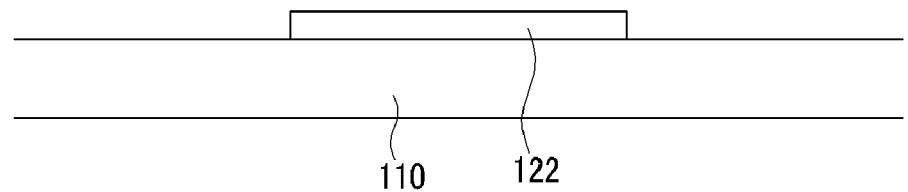
FIGS. 3A, 4A, 5A, 6A, 7A, 8A, 9A, 10A, 11A, 12A, 13A, 14A, 15A and 16A are cross-sectional views illustrating exemplary embodiments of processing steps of manufacturing the TFT panel cross-sectional view shown in FIG. 2A according to an exemplary embodiment of the present invention.
Figure 3B:
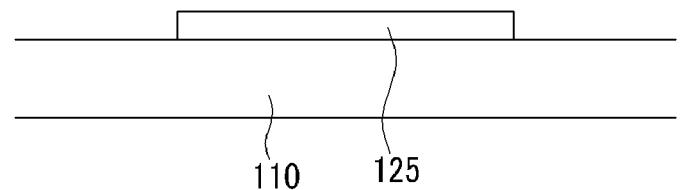
FIGS. 3B, 4B, 5B, 6B, 7B, 8B, 9B, 10B, 11B, 12B, 13B, 14B, 15B and 16B are cross-sectional views illustrating exemplary embodiments of processing steps of manufacturing the TFT panel cross-sectional view shown in FIG. 2B according to an exemplary embodiment of the present invention.
Figure 3C:
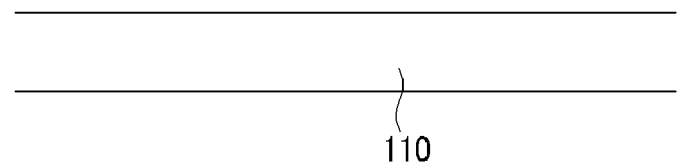
FIGS. 3C, 4C, 5C, 6C, 7C, 8C, 9C, 10C, 11C, 12C, 13C, 14C, 15C and 16C are cross-sectional views illustrating exemplary embodiments of processing steps of manufacturing the TFT panel cross-sectional view shown in FIG. 2C according to an exemplary embodiment of the present invention.

Referring to FIG. 3A to FIG. 3C, a gate conductive layer is deposited on an insulating substrate 10, e.g. by sputtering, and patterned using a photolithographic process to form a gate line 120 including a gate electrode 122 and a gate pad 125, and a storage electrode line 127. In one exemplary embodiment, the gate conductive layer can include double-layered structure such as Al and Mo, or Ti and Cu or other materials having similar characteristics as described above.

Figure 4A:
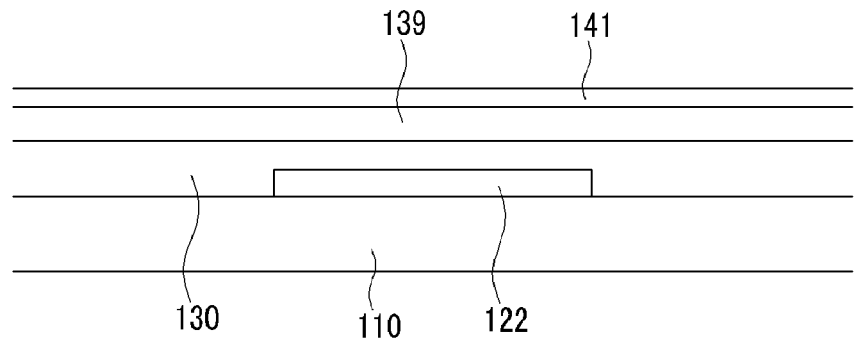
Figure 4B:
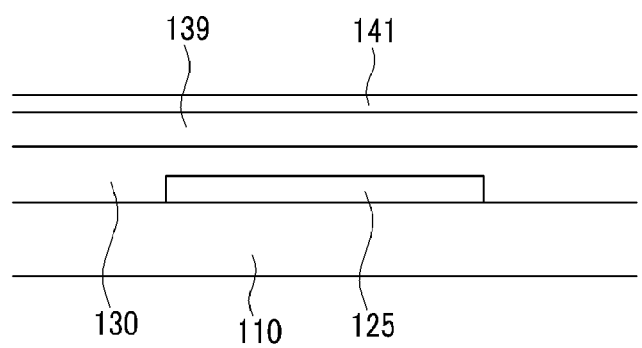
Figure 4C:
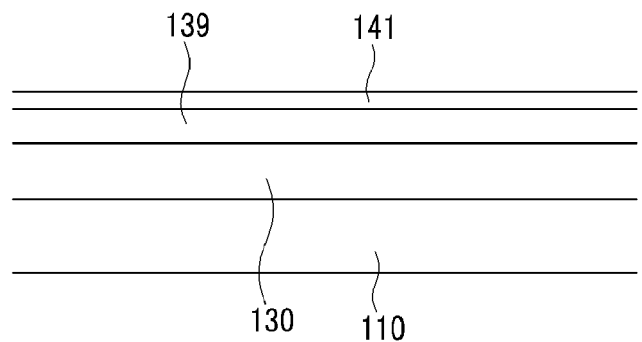

Referring to FIG. 4A to FIG. 4C, a gate insulating layer 130, a first amorphous silicon layer 139 such as hydrogenated amorphous silicon, and a second amorphous silicon layer 141 doped with n type impurity are sequentially deposited, e.g., by chemical vapor deposition ("CVD") on the gate line 120 and the storage electrode line 127.

Figure 5A:
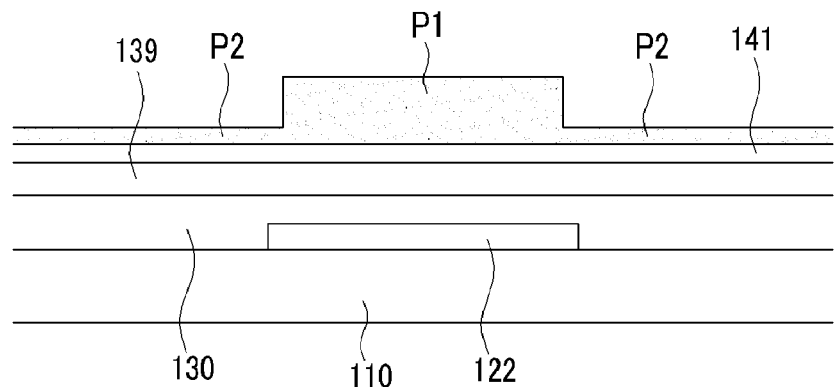
Figure 5B:
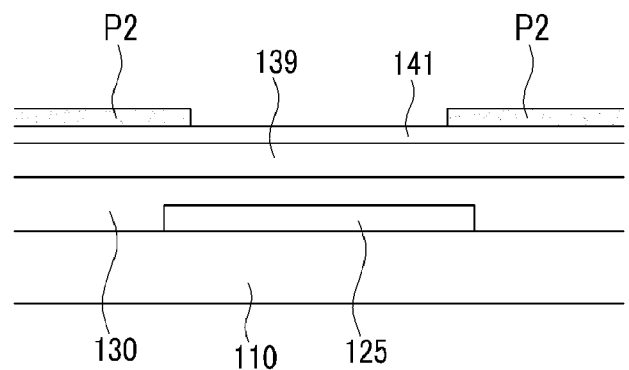
Figure 5C:
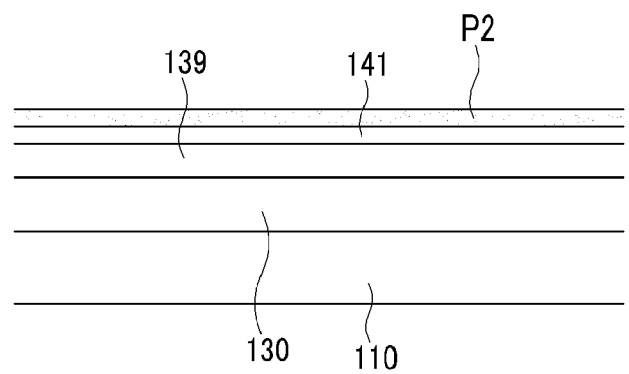

Referring to FIG. 5A to 5C, a photo-resist pattern is formed on the second amorphous silicon 141 except the area corresponding to the gate pad 125 using a photolithographic process. The photo-resist pattern includes a first photo-resist pattern P1 and a second photo-resist pattern P2. The second photo-resist pattern P2 is thinner than the first photo-resist pattern P1. The second photo-resist pattern P2 is disposed in the area except the region corresponding to the gate pad 125 and the first photo-resist pattern P1. A photo-resist film is removed in the region corresponding to the gate pad 125 to expose the second amorphous silicon layer 141 therethrough. The thickness of the photo-resist pattern P1 and P2 is determined according to an etching rate of the photo-resist material in an etching step to follow. Position dependant thickness of the photo-resist material may be formed by slit mask or half tone mask or other similar method.

Figure 6A:
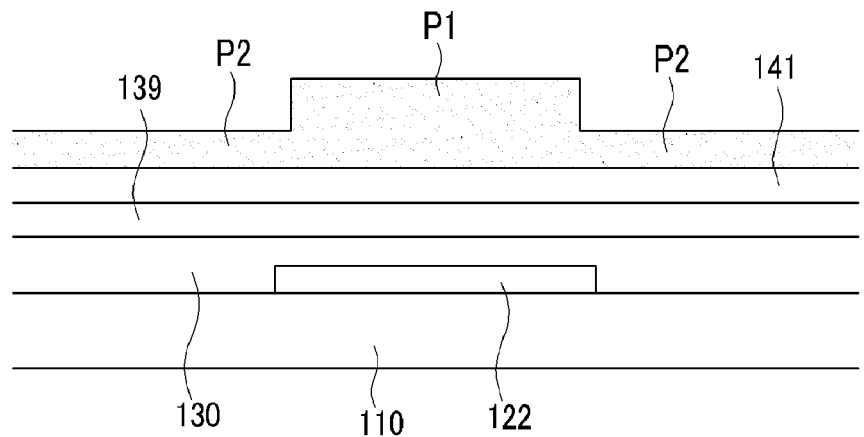
Figure 6B:
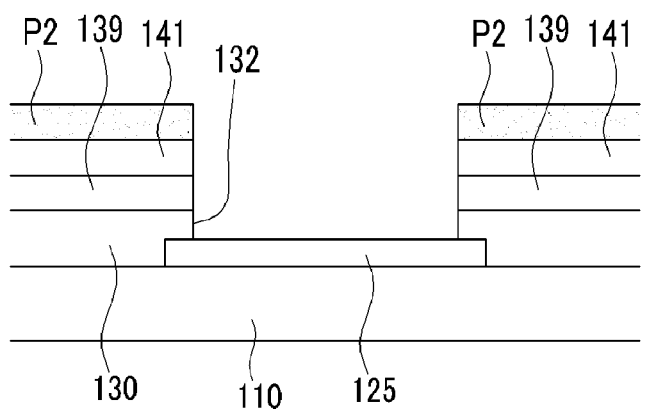
Figure 6C:
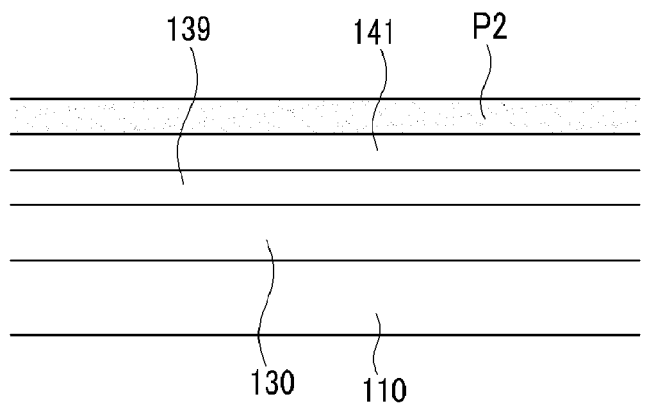

Referring to FIG. 6A to FIG. 6C, the second amorphous silicon layer 141, the first amorphous silicon layer 139, and the gate insulating layer 130 disposed in the area corresponding to the gate pad 125 are removed to expose the gate pad 125 and form a gate pad contact hole 132.

Figure 7A:
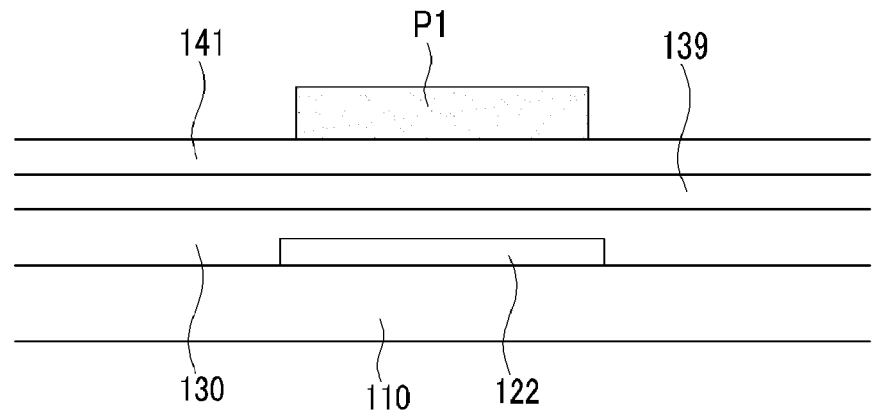
Figure 7B:
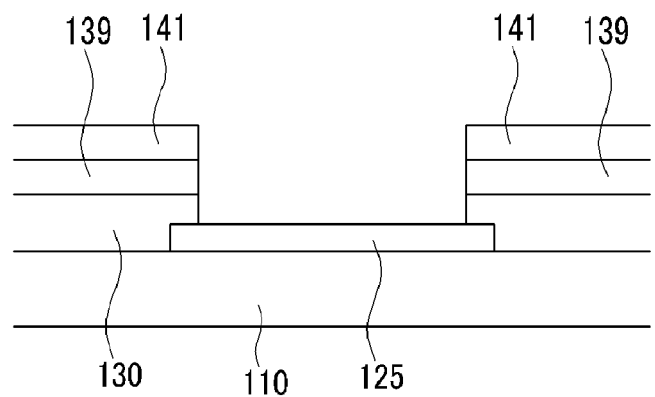
Figure 7C:
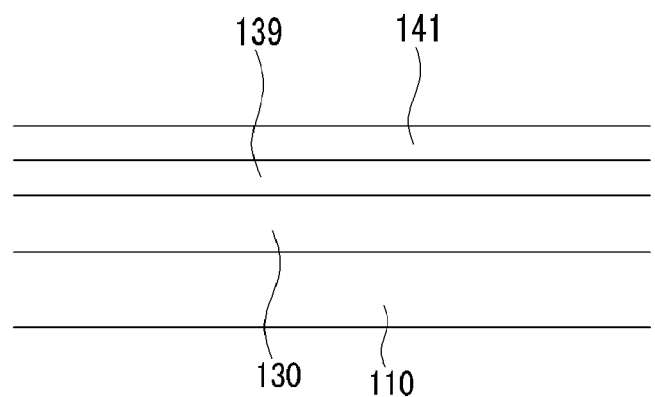

Referring to FIG. 7A to FIG. 7C, the second photo-resist pattern P2 is removed by an ashing process to expose the second amorphous silicon 141 therebelow.

Figure 8A:
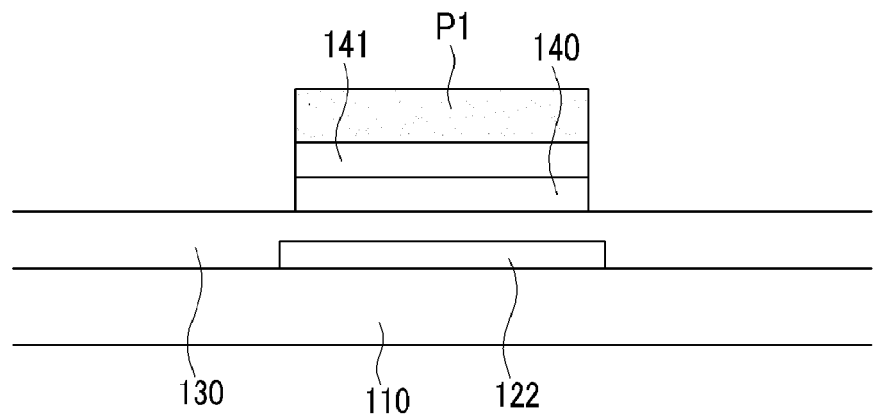
Figure 8B:
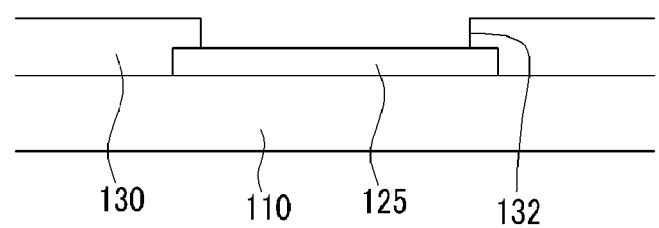
Figure 8C:
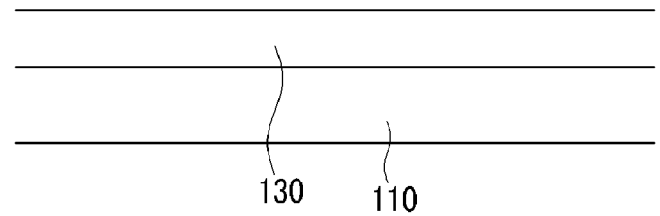

Referring to FIG. 8A to FIG. 8C, the exposed second amorphous silicon 141 and the first amorphous silicon 139 are removed using the first photo-resist pattern P1 as an etching mask to form a semiconductor layer 140 and an ohmic contact layer 141 and to expose a portion of the gate insulating layer 130.

Figure 9A:
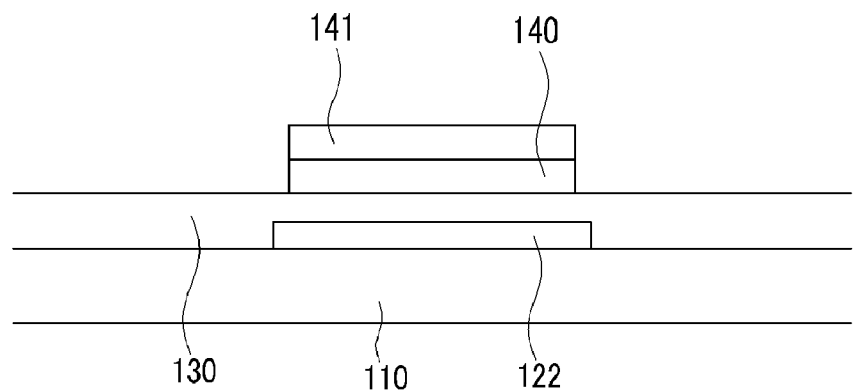
Figure 9B:
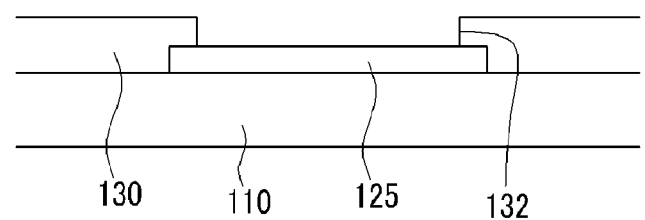
Figure 9C:
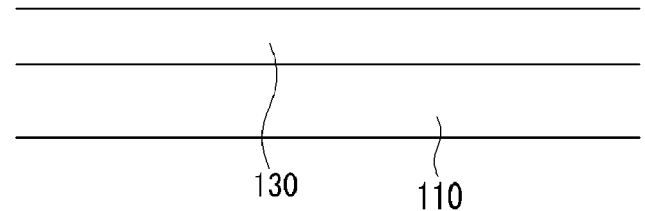

Referring to FIG. 9A to 9C, the photo-resist pattern P1 on the ohmic contact layer 141 is removed.

Figure 10A:
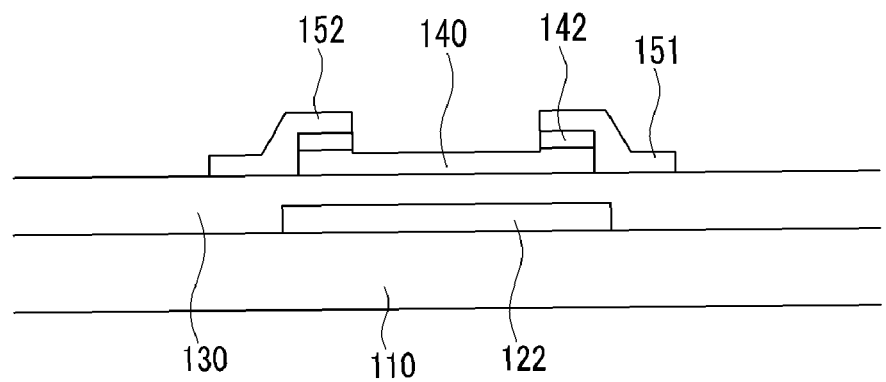
Figure 10B:
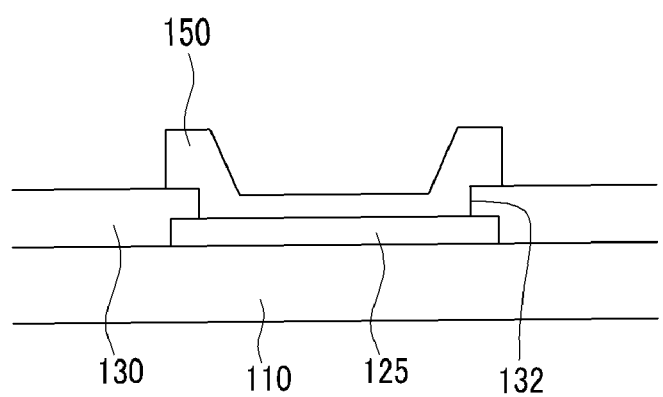
Figure 10C:
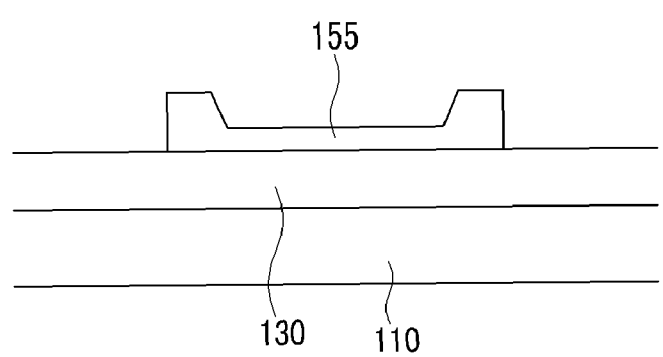

Referring to FIG. 10A to FIG. 10C, a data conductive layer is deposited on the semiconductor layer 140, the ohmic contact layer 141, and the exposed gate insulating layer 130. The data conductive layer is patterned using a photolithographic process to form a drain electrode 151 and a data line 153 including a source electrode 152 and a data pad 155, and an interconnector 150. The source electrode 152 is disposed substantially opposite to and is separated from the drain electrode 151 with respect to the gate electrode 122. The source electrode 152 and the drain electrode 151 cover the sidewalls of the semiconductor layer 140 and the ohmic contact layer 141 as described in detail above. The ohmic contact layer 141 disposed between the source electrode 152 and the drain electrode 151 is removed to complete the ohmic contact layer 142. The ohmic contact layer 142 is disposed only under the source electrode 152 and the drain electrode 151 to expose the semiconductor layer 140 therebetween.

The interconnector 150 is formed on the gate pad 125 and an edge of the interconnector 150 is formed on the gate insulating layer 130. The data pad 155 is formed on the gate insulating layer 130.

Figure 11A:
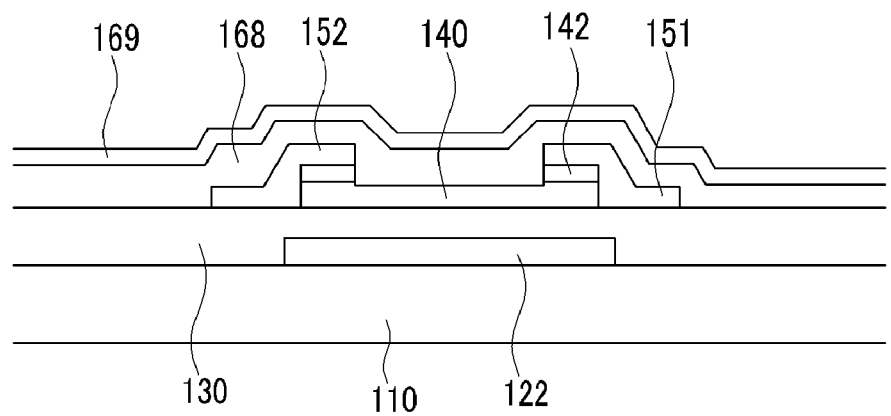
Figure 11B:
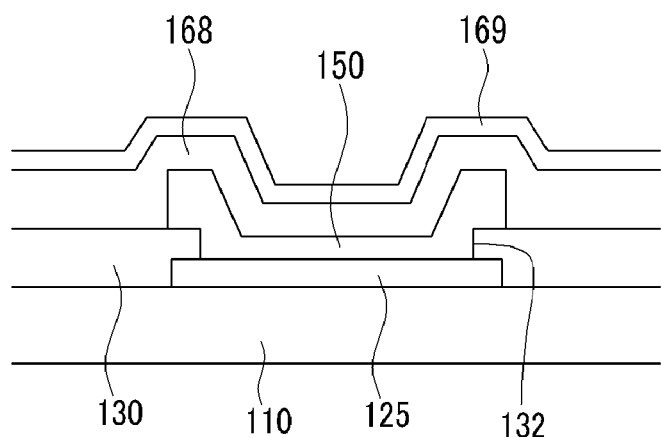
Figure 11C:
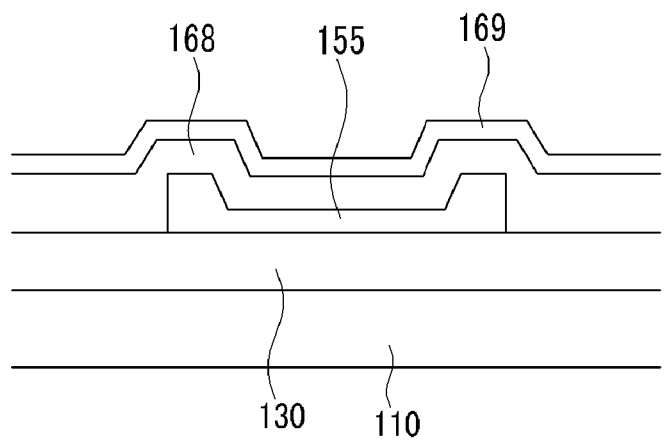

Referring to FIG. 11A to FIG. 11C, a first insulating layer 168 and a second insulating layer 169 are formed on the gate insulating layer 130, the drain electrode 151, the data line 153 including the source electrode 152 and the data pad 155, and the interconnector 150.

Exemplary embodiments of the first insulating layer 168 and the second insulating layer 169 can include silicon nitride ($SiN_x$) and other similar materials as discussed above. In one exemplary embodiment, the first insulating layer 168 and the second insulating layer 169 can be formed by CVD using ammonia ($NH_3$) and silane ($SiH_4$) as reaction gases. Etching rates of the first insulating layer 168 and the second insulating layer 169 can be adjusted by controlling the combination of constituents of the etching gas used or the composition ratio of the combination of constituents of the etching gas. In one exemplary embodiment, a ratio of ammonia to silane can be adjusted into about 2 to 1 or about 1:1 while forming the first insulation layer 168. A ratio of ammonia to silane can be adjusted into about 5 to 1 in while forming the second insulating layer 169. The adjustment of the ratio of ammonia to silane can control densities of the first insulating layer 168 and the second insulating layer 169, thereby controlling reactivities of the first insulating layer 168 and the second insulating layer 169 with etching gases or etching solutions. Accordingly, an etching rate can be controlled.

Figure 12A:
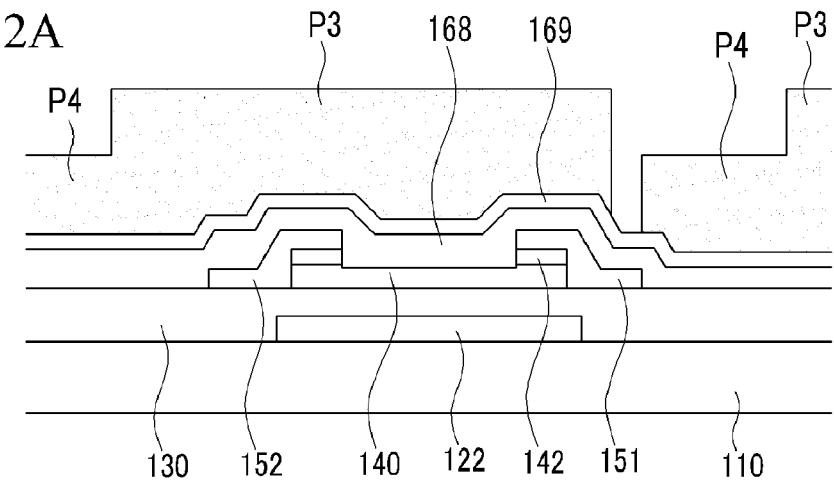
Figure 12B:
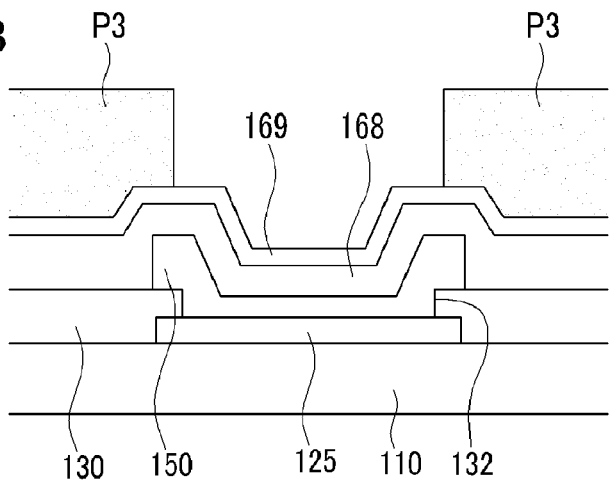
Figure 12C:
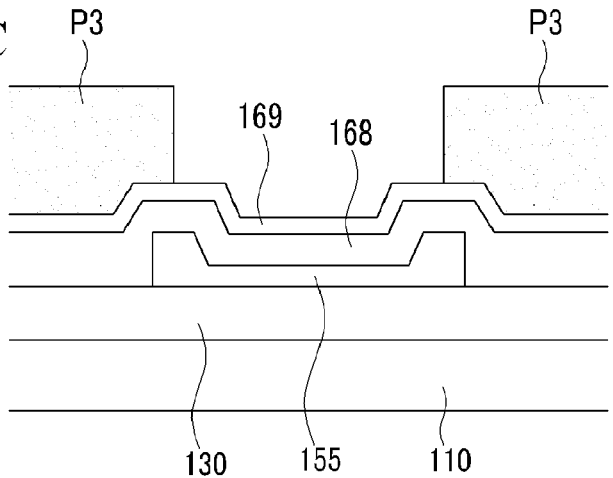

Referring to FIG. 12A to FIG. 12C, another photo-resist pattern is formed by a photolithographic process on the second insulating layer 169 except an area corresponding the drain contact hole 161, the gate pad 125 and the data pad 155 of FIG. 1. The photo-resist pattern includes a third photo-resist pattern P3 and a fourth photo-pattern P4. The fourth photo-resist pattern P4 is thinner than the third photo-resist patter P3. The fourth photo-resist pattern P4 is formed in the area corresponding to the pixel electrode 172 of FIG. 1. The thicknesses of the photo-resist patterns P3 and P4 are determined considering a removal rate in a subsequent etching step. Exemplary embodiments of the position dependant thickness of photo-resist may be formed by slit mask or half tone mask or other similar method.

The second insulating layer 169 in the area corresponding to the drain contact hole 161, the gate pad 125 and the data pad 155 is exposed.

Figure 13A:
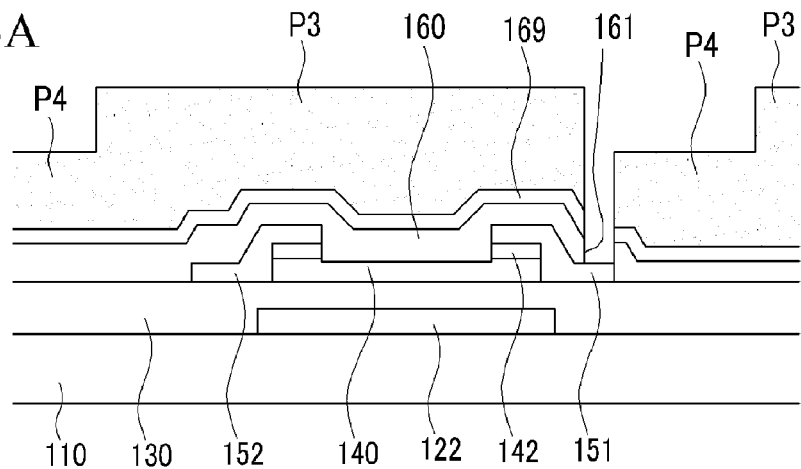
Figure 13B:
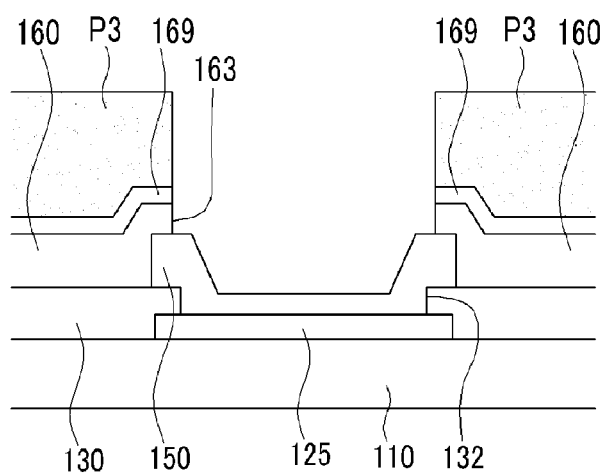
Figure 13C:
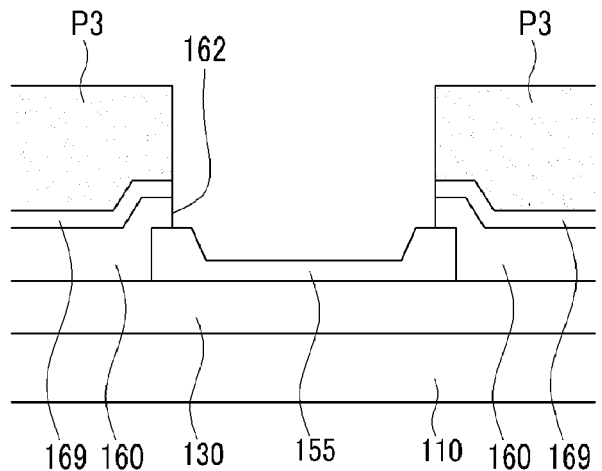

Referring to FIG. 13A to 13C, the second insulating layer 169 and the first insulating layer 168 are removed using the photo-resist pattern P3 and P4 as an etching mask to complete a drain contact hole 161, an interconnector contact hole 163 and a data pad contact hole 162, thereby forming a first protective film 160. The drain contact hole 161, the interconnector contact hole 163, and the data pad contact hole 162 expose a portion of the drain electrode 151, the interconnector 150, and the data pad 155 respectively.

Figure 14A:
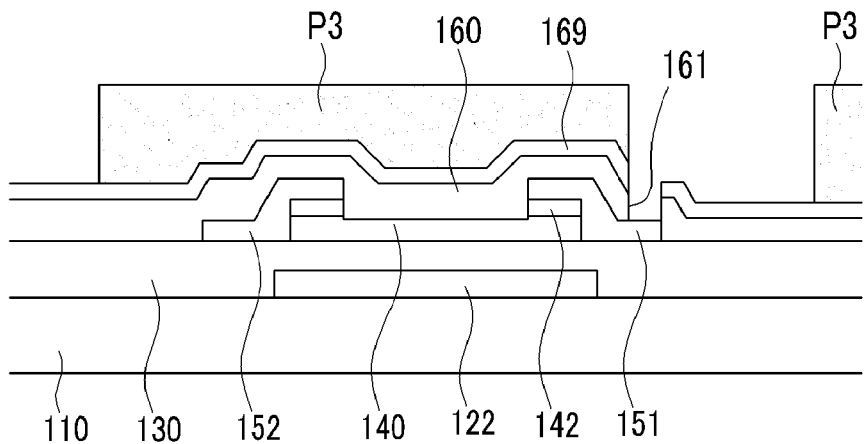
Figure 14B:
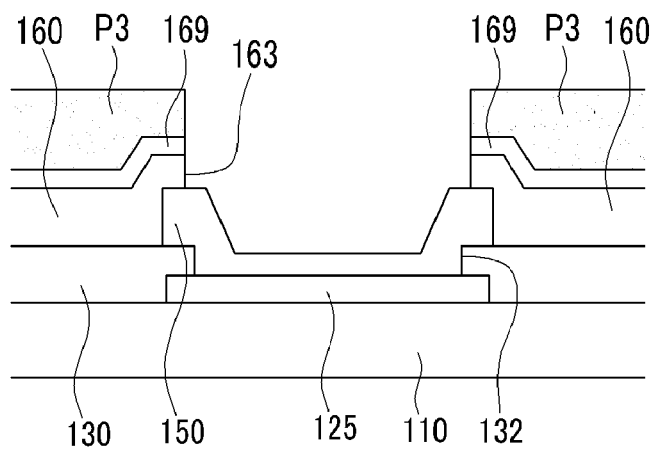
Figure 14C:
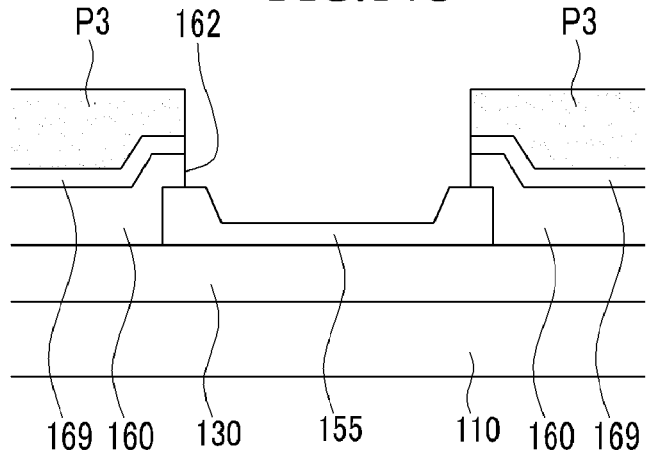

Referring to FIG. 14A to FIG. 14C, the photo-resist pattern P4 is removed by an ashing process to expose the second insulating layer 169 in the area corresponding to the pixel electrode of FIG. 1.

Figure 15A:
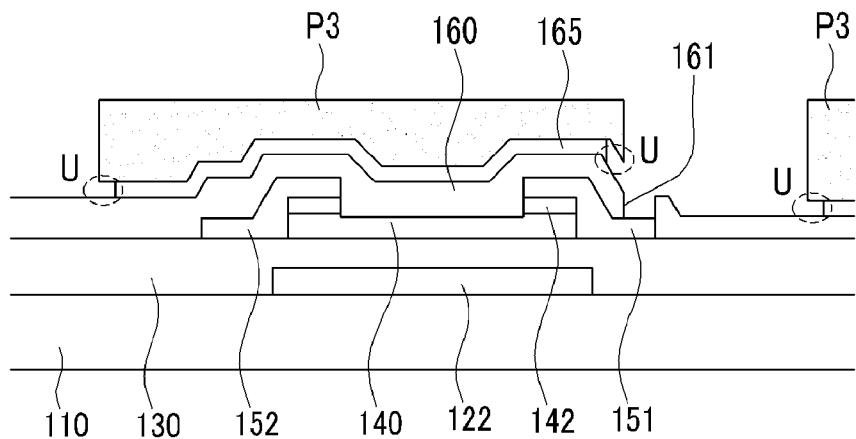
Figure 15B:
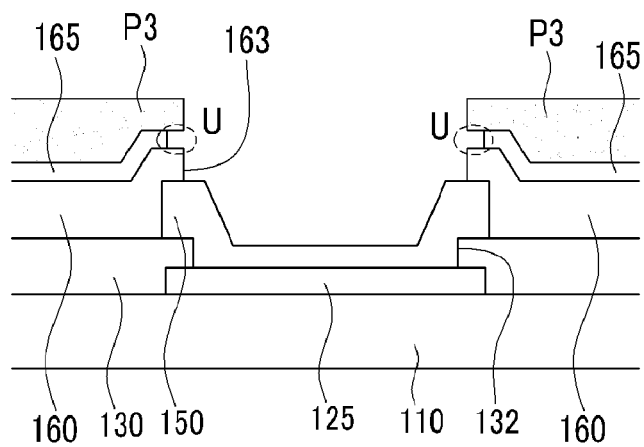
Figure 15C:
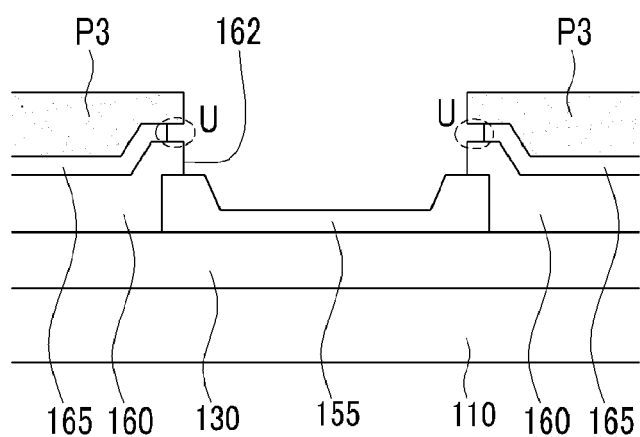

Referring to FIG. 15A to FIG. 15C, the exposed second insulating layer 169 is removed using the third photo-resist pattern P3 as an etching mask to expose a portion of the first protective film 160. At this step, the second insulating layer 169 is over-etched to partially remove sidewalls of the second insulating layer 169 under the third photo-resist pattern P3, thereby causing undercuts U and forming a second protective film 165. As a result, the sidewall of the first protective film 160 is protruded beyond the sidewall of the second protective film 165. In one exemplary embodiment, an etching gas may be used that provides an about 1:5 to about 1:20 ratio of an etching rate with respect to the first insulating layer 168 to an etching rate with respect to the second insulating layer 169. Exemplary embodiments of the etching gas may include $CF_4$, $O_2$, $CF_4$, $SF_6$, $CHF_3$, $O_2$ or combinations thereof. The etching rate can be controlled by adjusting the combination of constituents of the etching gas used or the composition ratio of the combination of constituents of the etching gas. The second insulating layer 169 is etched more rapidly than the first insulating layer 168, thereby over-etching the sidewall of the second insulating layer 169 under the third photo-resist pattern P3 and forming the undercuts U. In one exemplary embodiment, the width of the undercut is about 0.25 um or more.

In another exemplary embodiment, an etching resistant layer can be formed between the first insulating layer 168 and the second insulating layer 169 to protect the first insulating layer 168 during etching of the second insulating layer 169. Exemplary embodiments of the etching resistant layer can include silicon nitride (SiNx). Also, exemplary embodiments include configurations wherein the etching resistant layer can be denser than the first insulating layer 168 and the second insulating layer 169.

Figure 16A:
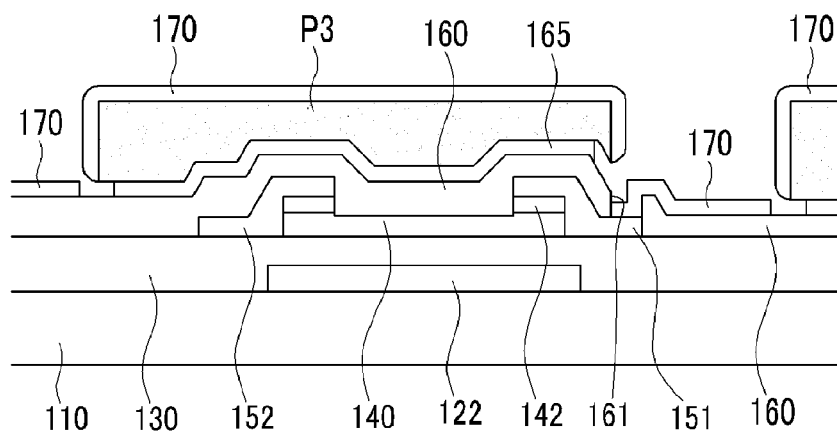
Figure 16B:
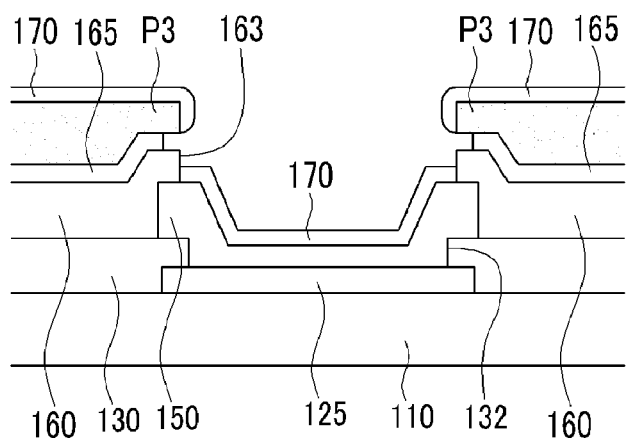
Figure 16C:
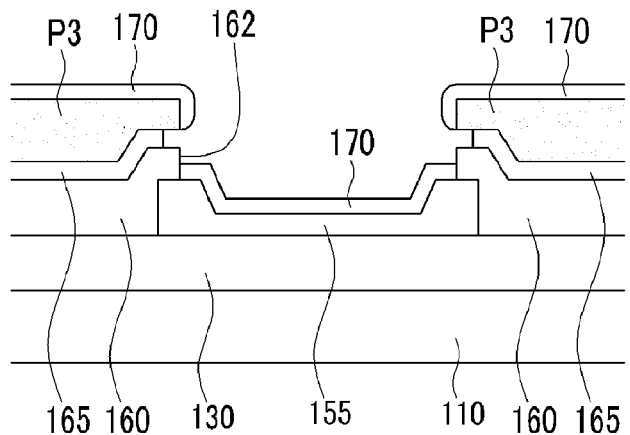

Referring to FIG. 16A to FIG. 16C, a transparent conductive layer 170 is formed on the third photo-resist pattern P3, the first protective film 160, the drain electrode 151 inside the drain contact hole 161, and the data pad 155 inside the data pad contact hole 162, essentially over the entire TFT panel except for the regions of the first protective layer 161 corresponding to the undercut. Exemplary embodiments of the transparent conductive layer 170 can include ITO, or IZO, or other materials having similar characteristics as discussed above.

Referring to FIG. 2A to FIG. 2C, the third photo-resist pattern P3 and the transparent conductive layer 170 disposed thereon are removed by a lift-off process to form a pixel electrode 172 and contact assistants 171 and 173. In one exemplary embodiment, if a photo-resist stripper including an amine group and a glycol group contacts the third photo-resist pattern P3 by spraying or dipping, it may exfoliate the third photo-resist pattern P3 from the second protective film 165 by dissolving the third photo-resist pattern P3. Simultaneously, the transparent conductive layer 170 on the third photo-resist pattern P3 may be removed. Here, a removal rate of the third photo-resist pattern P3 and the transparent conductive layer 170 thereon depends on the contact time and contact area of the photo-resist stripper on the third photo-resist pattern P3. At this step, the undercut U formed by the second protective film 165 under the third photo-resist pattern P3 increases the contact area between the photo-resist stripper and the third photo-resist pattern P3. Therefore, the third photo-resist pattern P3 and the transparent conductive layer 170 can be easily removed.

According to an exemplary embodiment of the present invention, a source electrode and a drain electrode cover sidewalls of a semiconductor layer to thereby reduce processing steps in a TFT panel manufacturing process. In addition, image degradation which results from a semiconductor layer protruding from a source electrode and a drain electrode can be reduced or effectively eliminated. Also, the semiconductor layer and a gate insulating layer are simultaneously patterned by a single photolithographic process using a photo-resist pattern having position dependant thickness, thereby forming a highly reliable gate pad member having a gate pad, an interconnector and a contact assistant without increasing the number of processing steps.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for manufacturing a thin film transistor panel, the method comprising;
   disposing a gate line including a gate electrode and a gate pad on an insulating substrate;
   disposing a gate insulating layer on the gate line;
   disposing a semiconductor layer on the gate insulating layer;
   disposing a data line including a source electrode on the semiconductor layer and a data pad;
   disposing a drain electrode spaced apart from the source electrode with respect to the gate electrode on the semiconductor layer;
   disposing a first insulating layer and a second insulating layer on the data line and the drain electrode;
   etching the first insulating layer and the second insulating layer to form a second protective film, a first protective film having a sidewall which protrudes beyond the second protective film and a first contact hole which exposes a portion of the drain electrode; and
   disposing a pixel electrode electrically connected to the drain electrode.

2. The method of claim 1, wherein forming the semiconductor layer comprises:
   depositing an amorphous silicon layer on the gate insulating layer;
   depositing an amorphous silicon layer doped with impurity on the amorphous silicon layer;
   disposing a first photo-resist pattern and a second photo-resist pattern thinner than the first photo-resist pattern on the amorphous silicon and the amorphous silicon doped with impurity;
   exposing the gate pad by removing the amorphous silicon, the amorphous silicon doped with impurity, and the gate insulating layer using the first photo-resist pattern and the second photo-resist pattern as an etching mask;
   exposing the amorphous silicon doped with impurity by removing the second photo-resist pattern;
   exposing the gate insulating layer by etching the amorphous silicon doped with impurity and the amorphous silicon using the first photo-resist pattern as an etching mask; and
   removing the first photo-resist pattern.

3. The method of claim 2, wherein disposing the data line and the drain electrode on the semiconductor layer comprises disposing an interconnector on the gate pad.

4. The method of claim 3, wherein forming the second protective film and the first protective film comprises;
   disposing a third photo-resist pattern and a fourth photo-resist pattern thinner than the third photo-resist pattern on the second insulating layer;
   exposing the interconnector and the data pad by etching the second insulating layer and the first insulating layer using the third photo-resist pattern and the fourth photo-resist pattern as an etching mask.

5. The method of claim 4, wherein forming the second protective film and the first protective film comprises;
   removing the fourth photo-resist pattern;
   etching the second insulating layer using the third photo-resist pattern as an etching mask to expose the first protective film, and etching a portion of the second insulating layer under the third photo-resist pattern to form an undercut.

6. The method of claim 5, wherein disposing the pixel electrode electrically connected to the drain electrode comprises:
   disposing a transparent conductive layer on the third photo-resist pattern and the first protective film; and
   removing the third photo-resist pattern.

7. The method of claim 6, further comprising using an etching gas which has a greater etching rate with respect to the second insulating layer than an etching rate with respect to the first insulating layer to form the undercut.

8. The method of claim 7, wherein the etching gas has an etching rate with respect to the second insulating layer which is about three times to about five times greater than an etching rate with respect to the first insulating layer.

9. The method of claim 6, wherein disposing the pixel electrode comprises disposing a contact assistant on the interconnector and the data pad.

10. A method for manufacturing a thin film transistor panel, the method comprising:
   disposing a gate line, the gate line including a gate electrode and a gate pad, on an insulating substrate;
   disposing a first insulating layer on the gate line;
   disposing a semiconductor layer on the first insulating layer;
   exposing a gate pad through the first insulating layer;
   forming a data line including a source electrode disposed on the semiconductor layer, a data pad disposed on the first insulating layer, a drain electrode disposed substantially opposite the source electrode with respect to the gate electrode, and an interconnector disposed on the exposed gate pad;
   disposing a second insulating layer and a third insulating layer on the data line and the drain electrode;
   etching the third insulating layer and the second insulating layer to form a contact hole which exposes a portion of the drain electrode; and
   disposing a pixel electrode electrically connected to the drain electrode.

* * * * *